(12) United States Patent
Haruna et al.

(10) Patent No.: US 10,159,142 B2
(45) Date of Patent: Dec. 18, 2018

(54) PRINTED WIRING BOARD WITH A REINFORCING MEMBER HAVING A DIFFUSION-BONDED NICKEL LAYER

(71) Applicants: TATSUTA ELECTRIC WIRE & CABLE CO., LTD., Higashiosaka-shi, Osaka (JP); TOKUSHU KINZOKU EXCEL CO., LTD., Toshima-ku, Tokyo (JP)

(72) Inventors: Yuusuke Haruna, Kizugawa (JP); Hiroshi Tajima, Kizugawa (JP); Masahiro Watanabe, Kizugawa (JP); Yukari Kobayashi, Tokyo (JP); Kiyoharu Sekiguchi, Tokyo (JP); Yoshihiro Hosoya, Tokyo (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 15/578,701

(22) PCT Filed: Jun. 1, 2016

(86) PCT No.: PCT/JP2016/066190
§ 371 (c)(1),
(2) Date: Nov. 30, 2017

(87) PCT Pub. No.: WO2016/194950
PCT Pub. Date: Dec. 8, 2016

(65) Prior Publication Data
US 2018/0103540 A1    Apr. 12, 2018

(30) Foreign Application Priority Data
Jun. 2, 2015    (JP) .................................. 2015-112296

(51) Int. Cl.
*H05K 1/02* (2006.01)
*B23K 20/02* (2006.01)
(Continued)

(52) U.S. Cl.
CPC ............. *H05K 1/0218* (2013.01); *B23K 1/19* (2013.01); *B23K 20/002* (2013.01);
(Continued)

(58) Field of Classification Search
None
See application file for complete search history.

(56) References Cited

U.S. PATENT DOCUMENTS 9,736,924 B2 *  8/2017  Watanabe ............ H05K 1/0218
9,867,280 B2 *  1/2018  Watanabe ............ H05K 1/0218
(Continued)

FOREIGN PATENT DOCUMENTS

JP    2004-351460 A    12/2004
JP    2005-194571 A    7/2006
(Continued)

OTHER PUBLICATIONS

International Search Report issued in connection with PCT/JP2016/066190.
Written Opinion issued in connection with PCT/JP2016/066190.

*Primary Examiner* — Dimary Lopez Cruz
*Assistant Examiner* — Muhammed Azam
(74) *Attorney, Agent, or Firm* — Potomac Law Group, PLLC

(57) ABSTRACT

A printed wiring board includes a base member that includes a ground wiring pattern and a printed wiring board reinforcing member bonded to the ground wiring pattern in a conductive state. The printed wiring board reinforcing member includes a metal base material layer and a nickel layer bonded to at least a surface on a side opposite to a side (Continued)

bonded to the ground wiring pattern of the metal base material layer by diffusion bonding.

8 Claims, 6 Drawing Sheets

(51) Int. Cl.
| | |
|---|---|
| B23K 20/00 | (2006.01) |
| B23K 20/24 | (2006.01) |
| B23K 35/00 | (2006.01) |
| B23K 35/02 | (2006.01) |
| B23K 1/19 | (2006.01) |
| H05K 3/32 | (2006.01) |
| H05K 1/09 | (2006.01) |
| H05K 1/18 | (2006.01) |
| B23K 20/16 | (2006.01) |
| B23K 20/227 | (2006.01) |
| B23K 101/42 | (2006.01) |
| B23K 103/04 | (2006.01) |
| B23K 103/18 | (2006.01) |

(52) U.S. Cl.
CPC ............ *B23K 20/023* (2013.01); *B23K 20/16* (2013.01); *B23K 20/227* (2013.01); *B23K 20/24* (2013.01); *B23K 35/002* (2013.01); *B23K 35/0233* (2013.01); *H05K 1/02* (2013.01); *H05K 1/0215* (2013.01); *H05K 1/0281* (2013.01); *H05K 1/09* (2013.01); *H05K 1/189* (2013.01); *H05K 3/321* (2013.01); *B23K 2101/42* (2018.08); *B23K 2103/05* (2018.08); *B23K 2103/18* (2018.08); *B23K 2103/26* (2018.08)

(56) References Cited

U.S. PATENT DOCUMENTS

| | | | |
|---|---|---|---|
| 2004/0078970 A1* | 4/2004 | Naitoh | H05K 3/423 |
| | | | 29/852 |
| 2009/0288862 A1* | 11/2009 | Tamura | H01L 23/498 |
| | | | 174/257 |
| 2012/0202090 A1 | 8/2012 | Yamamoto et al. | |
| 2016/0007444 A1* | 1/2016 | Watanabe | H05K 1/0215 |
| | | | 174/254 |
| 2016/0135290 A1* | 5/2016 | Tajima | H05K 1/0281 |
| | | | 174/254 |
| 2016/0242299 A1* | 8/2016 | Yoshida | H05K 3/0035 |
| 2016/0345428 A1 | 11/2016 | Watanabe et al. | |
| 2017/0290145 A1* | 10/2017 | Tajima | H05K 1/0281 |
| 2018/0103540 A1* | 4/2018 | Haruna | H05K 1/0218 |

FOREIGN PATENT DOCUMENTS

| | | |
|---|---|---|
| JP | 2009-218443 A | 9/2009 |
| JP | 2013-041869 A | 2/2013 |
| WO | WO2011/052517 A1 | 5/2011 |
| WO | WO2014/132951 A1 | 9/2014 |
| WO | WO2016/194950 A1 | 12/2016 |

\* cited by examiner

DIFFUSION LAYER RATIO $\dfrac{t_D/2}{t_{Ni}+t_D/2}$

PRINTED WIRING BOARD WITH A REINFORCING MEMBER HAVING A DIFFUSION-BONDED NICKEL LAYER

TECHNICAL FIELD

The present invention relates to a printed wiring board, a printed wiring board reinforcing member, and a printed circuit board used for mobile phones, computers, and the like.

BACKGROUND ART

Conventionally, a known printed wiring board includes a thin plate metal reinforcing member formed by performing nickel plating on a surface of a stainless steel plate at an mounted position for an electronic component (PATENT LITERATURE 1). Accordingly, nickel functions as a protecting layer against heat and humidity in the stainless steel plate in the printed wiring board. This allows for reinforcing the mounted position for the electronic component with the metal reinforcing member while maintaining a ground effect.

CITATION LIST

Patent Literature

PATENT LITERATURE 1: WO 2014/132951

SUMMARY OF INVENTION

Problems to be Solved by the Invention

A ground effect and a reinforcement function provided by a printed wiring board directly affects performance of an electronic device to which the printed wiring board is installed. In view of this, providing the high-reliable ground effect and reinforcement function for a longer period is desired.

The present invention has been made to solve the above-described problem. An object of the present invention is to provide a printed wiring board, a printed wiring board reinforcing member, and a printed circuit board that can maintain high-reliable ground effect and reinforcement function over a long period.

Solutions to the Problems

The present invention includes a base member and a printed wiring board reinforcing member. The base member includes a ground wiring pattern. The printed wiring board reinforcing member is bonded to the ground wiring pattern in a conductive state. The printed wiring board reinforcing member includes a metal base material layer and a nickel layer which is bonded, by a diffusion layer, to at least a surface on a side opposite to a side bonded to the ground wiring pattern of the metal base material layer.

The above-described configuration allows for reinforcing a position of the printed wiring board to which an electronic component is mounted by strength of the metal base material layer while for maintaining, by the nickel layer, high ground effect of electrically conducting the ground wiring pattern to an external ground potential via the printed wiring board reinforcing member.

In the printed wiring board reinforcing member, the nickel layer is firmly bonded by the diffusion layer. Diffusion bonding mutually diffuses nickel atoms in the nickel layer and metal atoms in the metal base material layer so that the nickel atoms and the metal atoms have concentration gradient and are mixed together to form the diffusion layer. Diffusion bonding is a metallic bonding in which the nickel layer and the metal base material layer become harmoniously integratable by the diffusion layer. Accordingly, adhesiveness (bonding strength) of the nickel layer to the metal base material layer becomes exceptionally excellent compared with adhesiveness (bonding strength) in the case of performing a chemical bonding by precipitating the nickel layer on the surface of the metal base material layer by plating. Therefore, the nickel layer is less likely to be peeled off even if, for example, a large external force is applied to the printed wiring board reinforcing member during production and handling of the printed wiring board. Accordingly, the printed wiring board is fabricated with designed specifications and a possibility of maintaining the performance increases. Consequently, the above-described configuration can maintain the high-reliable ground effect and reinforcement function over a long period.

In the printed wiring board reinforcing member in the printed wiring board of the present invention, the diffusion layer may have a thickness of 4.5 μm or less. When a thickness of the nickel layer is tNi, a relationship between a thickness tD of the diffusion layer and a distance $\{tNi+(tD/2)\}$ from a center position of the diffusion layer to a superficial layer surface of the nickel layer may be $(tD/2)/\{tNi+(tD/2)\} \leq 0.86$.

With the above-described configuration, the nickel layer can secure the bonding strength equal to or more than the bonding strength in the case where the nickel layer is formed on the metal base material layer by plating. Furthermore, even if, for example, the large external force is applied to the printed wiring board reinforcing member, the printed wiring board reinforcing member in which the nickel layer is less likely to be peeled off can be manufactured.

The metal base material layer in the printed wiring board of the present invention may be made of any of stainless steel, aluminum, and an aluminum alloy.

The above-described configuration makes it possible to thin the thickness of the printed wiring board reinforcing member while maintaining high strength of the printed wiring board reinforcing member.

A printed wiring board reinforcing member of the present invention is disposed opposed to a ground wiring pattern in a printed wiring board. The printed wiring board reinforcing member has an opposed one surface bonded to the ground wiring pattern in a conductive state. The printed wiring board reinforcing member has another surface electrically conducted with an external ground member at ground potential. The printed wiring board reinforcing member includes a metal base material layer and a nickel layer which is bonded, by a diffusion layer, to at least one surface of the metal base material layer.

With the above-described configuration, the nickel layer of the printed wiring board reinforcing member is firmly bonded by the diffusion layer. In view of this, the printed wiring board reinforcing member has the excellent adhesiveness of the nickel layer to the metal base material layer compared with the adhesiveness in the case of forming the nickel layer by plating. Therefore, the nickel layer is less likely to be peeled off even if, for example, the large external force is applied to the printed wiring board reinforcing member during production and handling of the printed wiring board reinforcing member. Consequently, the printed wiring board reinforcing member included in the printed wiring board can maintain the high-reliable ground effect and reinforcement function over a long period.

In the printed wiring board reinforcing member of the present invention, the diffusion layer may have a thickness of 4.5 µm or less. When a thickness of the nickel layer is tNi, a relationship between a thickness tD of the diffusion layer and a distance {tNi+(tD/2)} from a center position of the diffusion layer to a superficial layer surface of the nickel layer may be (tD/2)/{tNi+(tD/2)}≤0.86.

With the above-described configuration, the nickel layer can secure the bonding strength equal to or more than the bonding strength in the case where the nickel layer is formed on the metal base material layer by plating. Furthermore, even if, for example, the large external force is applied to the printed wiring board reinforcing member, the printed wiring board reinforcing member in which the nickel layer is less likely to be peeled off can be manufactured.

The metal base material layer in the printed wiring board reinforcing member of the present invention may be made of any one of stainless steel, aluminum, and an aluminum alloy.

The above-described configuration makes it possible to thin the thickness of the printed wiring board reinforcing member while maintaining high strength of the printed wiring board reinforcing member.

The printed wiring board reinforcing member of the present invention may include a conductive adhesive layer disposed at one surface of the metal base material layer.

The above-described configuration, which includes the conductive adhesive layer, makes it possible to easily bond the printed wiring board reinforcing member to the ground wiring pattern of the printed wiring board in the conductive state.

A printed circuit board of the present invention includes a base member, a printed wiring board reinforcing member, a conductive adhesive layer, and an electronic component. The base member includes a ground wiring pattern on at least one surface thereof. The printed wiring board reinforcing member is disposed opposed to the ground wiring pattern. The printed wiring board reinforcing member includes a nickel layer formed on at least a surface on a side opposite to a side of the ground wiring pattern of the metal base material layer and firmly bonded with a diffusion layer. The conductive adhesive layer bonds the ground wiring pattern of the base member and the printed wiring board reinforcing member together in a conductive state. The electronic component is disposed at a position corresponding to the printed wiring board reinforcing member on another surface of the base member.

With the above-described configuration, even if the printed circuit board is repeatedly bent, a position to which the printed wiring board reinforcing member is bonded is less likely to bend. In view of this, a failure such as the electronic component disposed at the position corresponding to the printed wiring board reinforcing member dropping out from the printed circuit board is prevented. With the printed wiring board reinforcing member, by forming the nickel layer at least on the surface on a side opposite to the side of the ground wiring pattern of the metal base material layer, high heat resistance and moisture resistance on the surface side on which the nickel layer is formed are realized regardless of whatever kind of the metal base material layer is. Accordingly, with the printed wiring board reinforcing member, even if the surface side on which the nickel layer is formed is exposed under a high humidity environment, the nickel layer can reduce a speed of deterioration of an increase in resistance value. Consequently, the printed circuit board can be reinforced by the strength of the metal base material layer while maintaining, by the nickel layer, the high ground effect of electrically conducting the ground wiring pattern to an external ground potential via the conductive adhesive layer and the printed wiring board reinforcing member.

In the printed wiring board reinforcing member, the nickel layer is firmly bonded by the diffusion layer. In view of this, the printed wiring board reinforcing member has the excellent adhesiveness of the nickel layer to the metal base material layer compared with the adhesiveness in the case of forming the nickel layer by plating. Therefore, the nickel layer is less likely to be peeled off even if, for example, the large external force is applied to the printed wiring board reinforcing member during production and handling of the printed wiring board. Accordingly, the printed wiring board is fabricated with the designed specifications and the possibility of maintenance improves. Consequently, the above-described configuration can maintain the high-reliable ground effect and reinforcement function over a long period.

Effects of the Invention

High-reliable ground effect and reinforcement function can be maintained over a long period.

DESCRIPTION OF EMBODIMENTS

The following will describe a preferred embodiment of the present invention with reference to the drawings.
(Printed Wiring Board 1)

Figure 1:
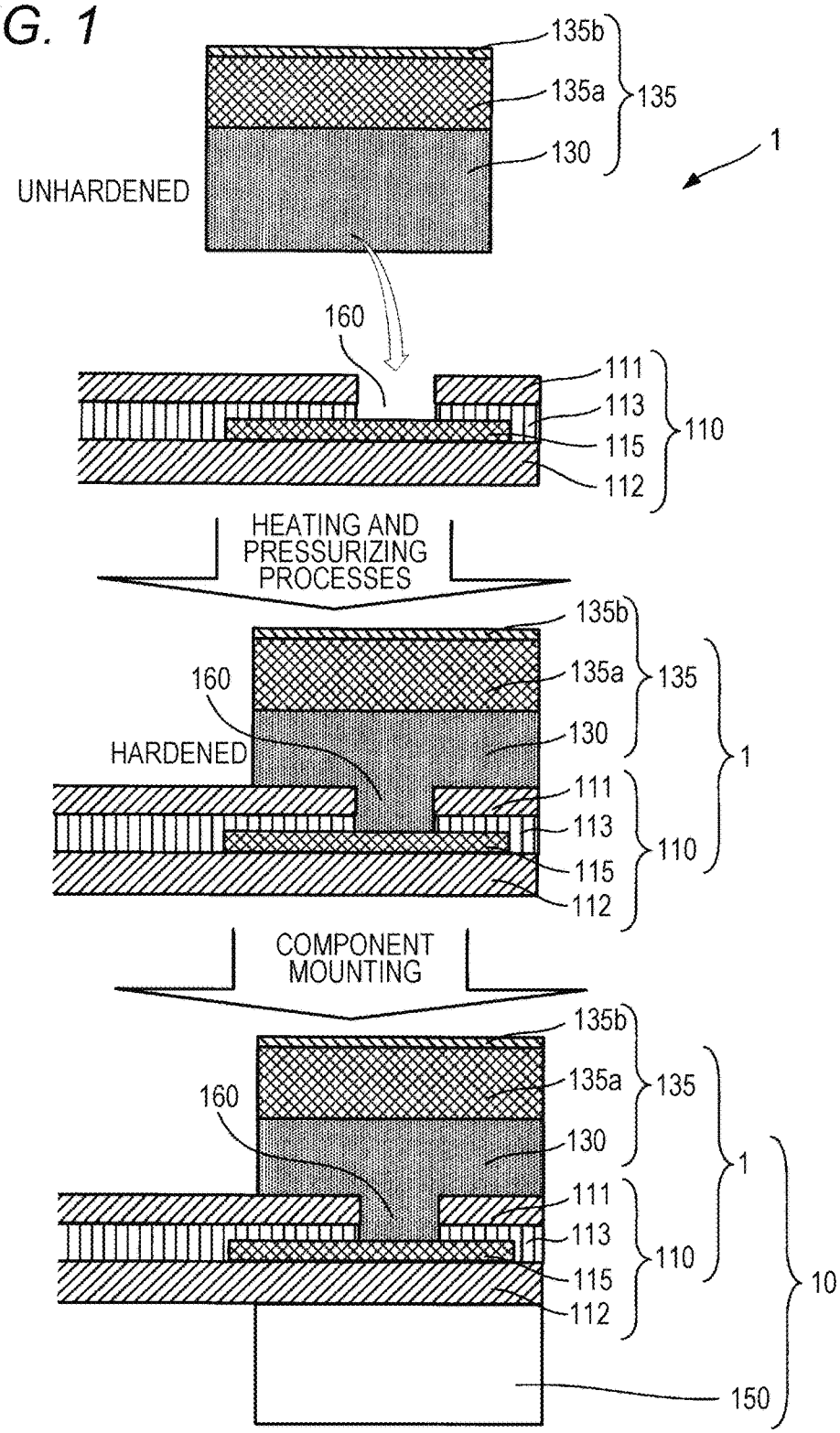
FIG. 1 is an explanatory drawing illustrating manufacturing processes for a printed wiring board and a printed circuit board.

As illustrated in FIG. 1, a printed wiring board 1 includes a printed wiring board main body 110 and a printed wiring board reinforcing member 135 (hereinafter referred to as a reinforcing member 135), which is bonded to one surface of the printed wiring board main body 110. The printed wiring board main body 110 includes a ground wiring pattern 115. To the ground wiring pattern 115, a conductive adhesive layer 130 of the reinforcing member 135 is bonded. The printed wiring board 1 is configured as a printed circuit board 10 by disposing an electronic component 150 on an mounted position in another surface of the printed wiring board main body 110 corresponding to a bonding position of the reinforcing member 135.

Figure 2:
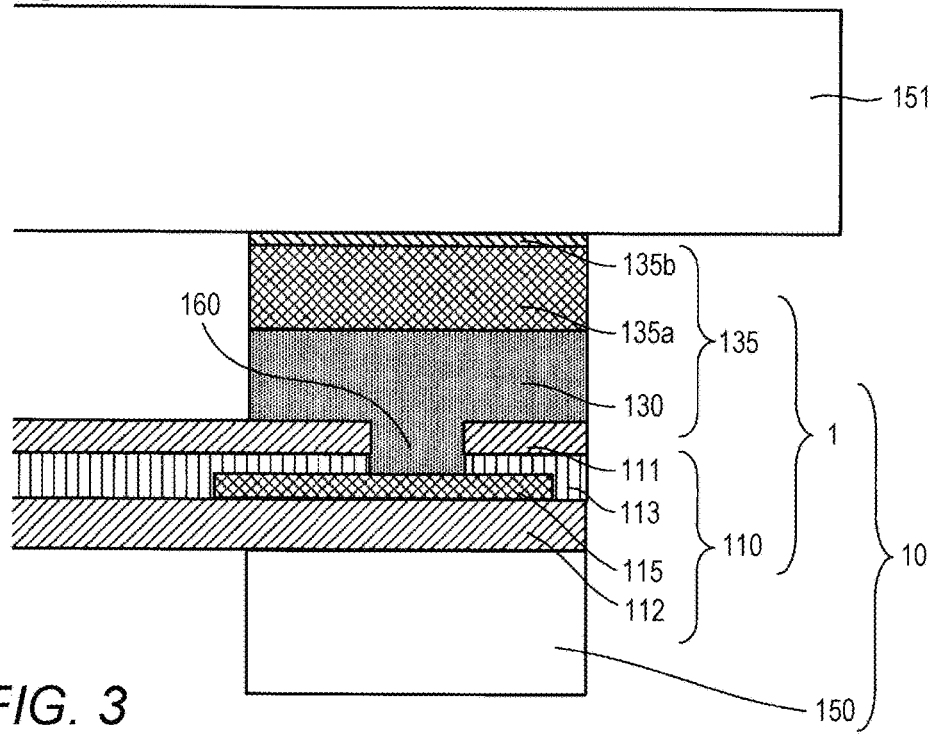
FIG. 2 is an explanatory drawing illustrating a state of the printed circuit board being connected to an external ground member.

In the printed circuit board 10, the mounted position of the electronic component 150 is reinforced because the reinforcing member 135 reinforces the bonding position with the printed wiring board main body 110. As illustrated in FIG. 2, in the printed circuit board 10, the reinforcing member 135 is connected to an external ground member 151 at ground potential. Accordingly, the ground wiring pattern 115 is grounded to the external ground member 151 via the reinforcing member 135. The external ground member 151 is, for example, a casing of the electronic device. Thus, when the printed circuit board 10 is embedded into the electronic device, the ground wiring pattern 115 is electrically conducted with the external ground member 151 via the reinforcing member 135. This ensures obtaining a high ground effect.

(Printed Wiring Board 1: Printed Wiring Board Main Body 110)

As illustrated in FIG. 1, the printed wiring board main body 110 includes a base member 112 on which a plurality of wiring patterns such as a signal wiring pattern and the ground wiring pattern 115 are formed, an adhesive layer 113 provided on the base member 112, and an insulating film 111 adhered to the adhesive layer 113.

The signal wiring pattern and the ground wiring pattern 115 are formed on the upper surface of the base member 112. These wiring patterns are formed by performing an etching process on a conductive material. Among the wiring patterns, the ground wiring pattern 115 means a pattern maintained at the ground potential.

The adhesive layer 113 is an adhesive interposed between the signal wiring pattern and the ground wiring pattern 115; and the insulating film 111. This adhesive layer 113 plays roles of maintaining insulation and causing the insulating film 111 to be adhered to the base member 112. The adhesive layer 113 is 10 µm to 40 µm in thickness, but the thickness needs not to be particularly limited and can be set as necessary.

Both the base member 112 and the insulating film 111 are made of engineering plastics. Examples of the engineering plastics include resins such as polyethylene terephthalate, polypropylene, cross-linked polyethylene, polyester, polybenzimidazole, polyimide, polyimidoamide, polyetherimide, and polyphenylene sulfide. When heat resistance is not required so much, a polyester film is preferable for its inexpensiveness. When fire retardance is required, a polyphenylene sulfide film is preferable. When the heat resistance is further required, a polyimide film, a polyamide film, or a glass epoxy film is preferable. The base member 112 is 10 µm to 40 µm in thickness and the insulating film 111 is 10 µm to 30 µm in thickness, but the thicknesses need not to be particularly limited and can be set as necessary.

The above-described insulating film 111 and adhesive layer 113 are provided with a hole 160 made by a mold or the like. The hole 160 causes a part of a region of a wiring pattern selected from the plurality of signal wiring patterns and ground wiring patterns to be exposed. In the embodiment, the hole 160 is formed in a direction in which the insulating film 111 and the adhesive layer 113 are stacked, so that a part of the region of the ground wiring pattern 115 is exposed to the outside. A hole diameter of the hole 160 is suitably configured so as not to expose another adjacent wiring pattern.

The flexible printed wiring board main body 110 may include a film to shield an electromagnetic wave on the top surface of the insulating film 111. This film includes a conductive material, a conductive layer adhered to this conductive material in a contact state, and an insulating layer disposed on the conductive layer. This film can use a conductive adhesive as the conductive material and the conductive layer.

(Printed Wiring Board Reinforcing Member 135)

The reinforcing member 135 is formed into a thin plate shape. The reinforcing member 135 has a bonded surface (a lower surface) bonded to the ground wiring pattern 115, an open surface (a top surface) electrically connected to an external ground at the ground potential, and side surfaces interposed between the bonded surface and the open surface. The reinforcing member 135 has a metal base material layer 135a constituting the bonded surface (the lower surface) and a nickel layer 135b constituting the open surface (the top surface). The reinforcing member 135 is disposed opposed to the ground wiring pattern 115 in the flexible printed wiring board 1. The reinforcing member 135 has the opposed one surface (the bonded surface) bonded to the ground wiring pattern 115 in the conductive state and another surface (the open surface bonded to an external ground member (not illustrated) having the ground potential in the conductive state.

The "bonded . . . in the conductive state" includes a state of bonding by direct contact or abutment and includes a state of indirect bonding via the conductive adhesive layer 130 or the like. The nickel layer 135b may be formed on the open surface and the bonded surface of the reinforcing member 135 or may be formed on the entire surface of the reinforcing member 135 constituted of the bonded surface, the open surface, and the side surfaces. The details will be described later.

(Printed Wiring Board Reinforcing Member 135: Metal Base Material Layer 135a)

The metal base material layer 135a is formed of a stainless steel so as to reinforce the bonding position (the mounted position for the electronic component 150) in the printed wiring board 1. This makes it possible for the metal base material layer 135a to thin the thickness of the reinforcing member 135 while maintaining high strength of the reinforcing member 135.

While the metal base material layer 135a is preferably formed of the stainless steel in terms of corrosion resistance, the strength, and the like, the material is not limited to stainless steel. The metal base material layer 135a may be made of another kind of metal. For example, the metal base material layer 135a may be made of aluminum, nickel, copper, silver, tin, gold, palladium, chromium, titanium, zinc, and an alloy containing any one or at least two of these materials.

The lower limit value of the thickness of the metal base material layer 135a is preferably 0.05 mm, and more preferably 0.1 mm. The upper limit value of the thickness of the metal base material layer 135a is preferably 1.0 mm, and more preferably 0.3 mm. The thickness needs not to be particularly limited and can be set as necessary.

(Printed Wiring Board Reinforcing Member 135: Nickel Layer 135b)

The nickel layer 135b is bonded to a surface on a side opposite to a side bonded to the ground wiring pattern 115 of the metal base material layer 135a. Accordingly, the nickel layer 135b causes the ground wiring pattern 115 to be electrically conducted with the external ground potential via the reinforcing member 135, ensuring maintaining the ground effect high.

The thickness of the nickel layer 135b is set to 1 μm or more and 4 μm or less. This allows for material cost reduction of nickel while achieving desired heat resistance and moisture resistance. Furthermore, a yield during punching and cutting for processing the reinforcing member 135 into a desired size can be increased. The lower limit value of the thickness of the nickel layer 135b is preferably 1 μm, and more preferably 2 μm for sufficient corrosion resistance, moisture resistance, and heat resistance of the reinforcing member 135. The upper limit value of the thickness of the nickel layer 135b is preferably 4 μm and more preferably 3 μm in consideration of the cost.

The nickel layer 135b is firmly bonded, by the diffusion layer, to the surface of the metal base material layer 135a. Here, diffusion bonding mutually diffuses nickel atoms in the nickel layer 135b and metal atoms in the metal base material layer 135a so that the nickel atoms and the metal atoms have concentration gradient and are mixed together to form the diffusion layer. Diffusion bonding is a metallic bonding in which the nickel layer 135b and the metal base material layer 135a become harmoniously integratable by the diffusion layer.

Accordingly, adhesiveness (bonding strength) of the nickel layer 135b to the metal base material layer 135a becomes exceptionally excellent compared with adhesiveness (bonding strength) in the case of performing a chemical bonding by precipitating the nickel layer 135b on the surface of the metal base material layer 135a by plating. Therefore, the nickel layer 135b is less likely to be peeled off even if a large external force is applied to the reinforcing member 135 during, for example, production and handling of the printed wiring board 1. Accordingly, the printed wiring board 1 is fabricated with designed specifications and a possibility of maintaining the performance increases. Consequently, the printed wiring board 1 can maintain the high-reliable ground effect and reinforcement function over a long period.

The thickness of the diffusion layer formed by the diffusion bonding is set to be 4.5 μm or less because of the following reasons. This thickness secures the bonding strength equal to or more than the bonding strength in the case where the nickel layer 135b is formed on the metal base material layer by plating and allows for manufacturing the printed wiring board reinforcing member where the nickel layer is less likely to be peeled off even in the case where, for example, the large external force is applied to the printed wiring board reinforcing member. The upper limit value of the thickness of the diffusion layer is preferably 4.5 μm, and more preferably 4.2 μm.

When a thickness of the nickel layer is tNi a, relationship between thickness tD of the diffusion layer and distance {tNi+(tD/2)} from a center position of the diffusion layer to a superficial layer surface of the nickel layer is set to (tD/2)/{tNi+(tD/2)}≤0.86. In this case, the nickel layer 135b can secure the bonding strength equal to or more than the bonding strength in the case where the nickel layer 135b is formed on the metal base material layer 135a by plating. Furthermore, even if the large external force is applied to the printed wiring board reinforcing member, the printed wiring board reinforcing member in which the nickel layer is less likely to be peeled off can be manufactured. Regarding the relationship between the thickness tD of the diffusion layer and the distance {tNi+(tD/2)}, the upper limit value of a diffusion layer ratio is preferably 0.86, more preferably 0.80, and further preferably 0.75.

To guarantee the excellent conductive property and flexibility of a bending portion, the nickel layer 135b is preferably pure nickel. Note that, even if the nickel layer 135b is a nickel alloy, the effects of the present invention are not damaged. Electroless plating and the like form high-hardness, fine, amorphous plated layer made of nickel and phosphorus. In view of this, compared with the pure nickel plating, high moisture resistance and high surface hardness are obtained. However, a crack at the surface of the bending portion and the like becomes a problem so that the plated layer cannot be thickened. In contrast to this, the nickel layer on which the diffusion bonding has been performed completely covers the metal base material layer at a predetermined thickness by rolling so that the reinforcing member 135 may have the excellent corrosion resistance. Furthermore, bonding the high-purity nickel layer obtains the excellent conductive property.

When finding a relationship of Young's modulus (GPa) to plate thicknesses (mm) between a nickel-plated printed wiring board reinforcing member (Ni plating) and a printed wiring board reinforcing member (Ni/SUS/Ni) including the diffusion layer, measurement results in Table 1 were obtained. The Young's modulus (GPa) to the plate thickness (mm) is the longitudinal elastic modulus (the Young's modulus) calculated based on a resonance frequency obtained by a cantilever resonance method (JIS Z 2280). The reason of obtaining the longitudinal elastic modulus (the Young's modulus) in accordance with JIS Z 2280 is as follows. Originally, the Young's modulus (GPa) should be measured by a transverse vibration method. However, with the thin sample of the printed wiring board reinforcing member, the sample warps and the sample swings during the measurement. Accordingly, the measurement cannot be performed by the transverse vibration method. In view of this, the resonance frequency needs to be obtained by vibrating the sample in the cantilevered manner.

In Table 1, the Young's modulus of the printed wiring board reinforcing member (Ni plating) is 229.9 GPa at the plate thickness of 0.05 mm and 229.9 GPa at the plate thickness of 0.10 mm. In contrast to this, the Young's modulus of the printed wiring board reinforcing member (Ni/SUS/Ni) is 193.6 GPa at the plate thickness of 0.05 mm and 190.7 GPa at the plate thickness of 0.10 mm. Consequently, since the nickel layer is crystalline, the printed wiring board reinforcing member (Ni/SUS/Ni) has the Young's modulus lower than that of the amorphous plated layer of the printed wiring board reinforcing member (Ni plating) and has a property of easily bent when adhered on a flexible printed wiring and the like.

TABLE 1

| Constitution of reinforcing plate | Plate thickness (mm) | Young's modulus (GPa) |
|---|---|---|
| Ni plating | 0.05 | 229.9 |
|  | 0.10 | 229.9 |
| Ni/SUS/Ni | 0.05 | 193.6 |
|  | 0.10 | 190.7 |

Figure 3:
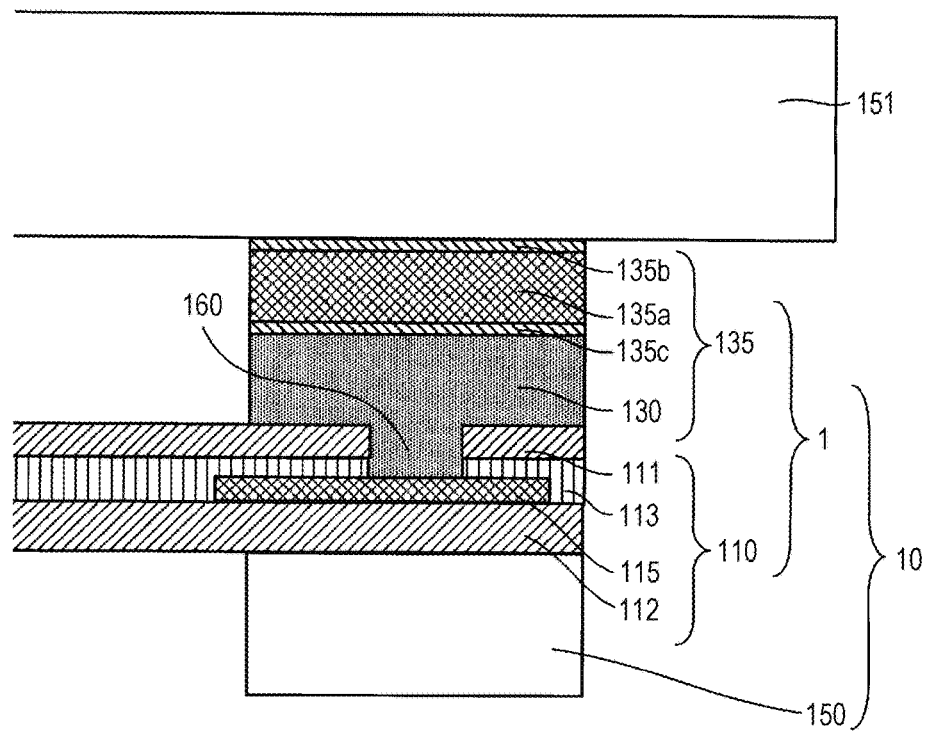
FIG. 3 is an explanatory drawing illustrating a state of the printed circuit board being connected to the external ground member.

In this embodiment, the case where the diffusion bonding is performed on the nickel layer 135b to one surface of the metal base material layer 135a is described, but the embodiment is not limited to this. That is, as illustrated in FIG. 3, the diffusion bonding may be performed on nickel layers 135b and 135c on one surface and the other surface of the metal base material layer 135a. In the case where the nickel layers 135b and 135c are formed on both surfaces of the metal base material layer 135a, the top and the bottom of the metal base material layer 135a needs not to be considered when the conductive adhesive layer 130 is adhered. This ensures improvement in work efficiency.

The surface states of the nickel layers 135b and 135c may be identical or may be different depending on the material of a contact target and the like. The surfaces of the nickel layers 135b and 135c can be surfaces with any given concavo-convex shape and depth by processing a surface of a rolling roll described later. Therefore, for example, the nickel layer 135b can have the surface state appropriate for the material, the shape, and the like of the contact-target external ground member 151. The nickel layer 135c can have the surface state appropriate for the material and the like of the contact-target conductive adhesive layer 130.

Figure 4A:
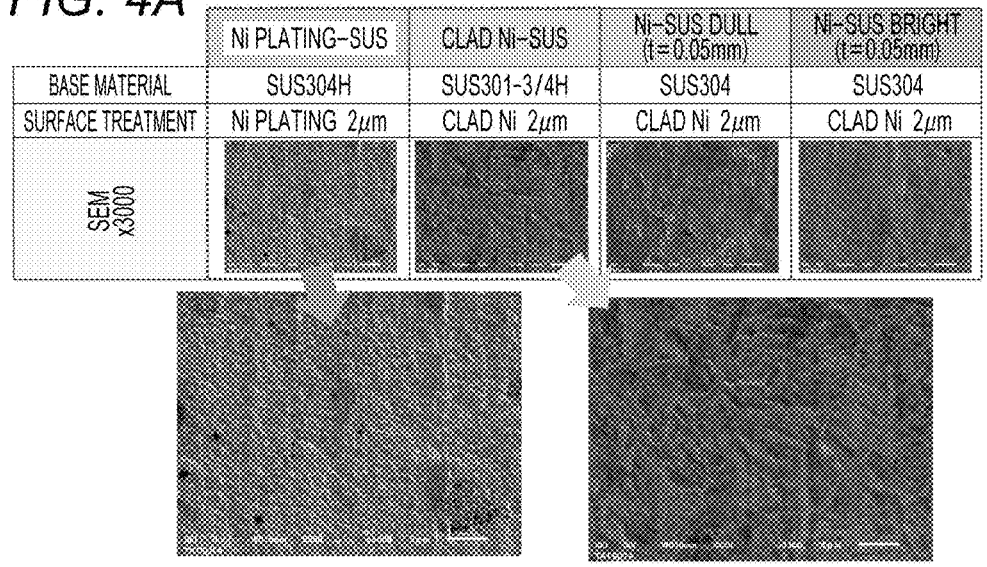
FIG. 4A is an explanatory drawing illustrating the surface states of nickel layers.

The following describes the surface states of the nickel layers 135b and 135c in detail. As illustrated in FIG. 4A, processing the roll surface of the rolling roll described later allows for appropriately selecting roughness from a plurality of types such as three types: a standard roughness type, a dull type with roughness larger than the standard roughness, and a bright type with roughness smaller than the standard roughness.

FIG. 4A is a drawing illustrating the surface states when the surfaces of the nickel layers are observed with a magnification of 3000 powers using a scanning electron microscope. That is, FIG. 4A illustrates the surface states of "Ni plating-SUS," "clad Ni-SUS," "Ni-SUS dull" dull roughness type, and "Ni-SUS bright."

"Ni plating-SUS": a base material (SUS304H) on which the nickel plating is performed with a layer thickness of 2 μm.

"Clad Ni-SUS": a base material (SUS301-3/4H) to which the diffusion bonding is performed on a nickel foil with a layer thickness of 2 μm by the rolling roll with the standard roughness.

"Ni-SUS dull" dull roughness type: a base material (SUS304H) to which the diffusion bonding is performed on a nickel foil with a layer thickness of 2 μm by the rolling roll with the dull roughness.

"Ni-SUS bright": a base material (SUS304H) to which the diffusion bonding is performed on a nickel foil with a layer thickness of 2 μm by the rolling roll with the bright roughness.

Thus, when the nickel layers 135b and 135c are formed by the diffusion bonding, the desired surface state can be obtained by the rolling roll.

Figure 4B:
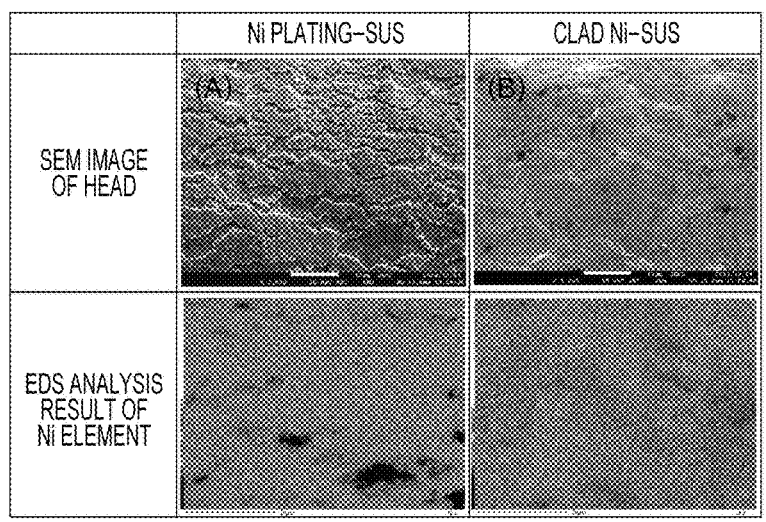
FIG. 4B is an explanatory drawing illustrating the surface states of nickel layer.

FIG. 4B is a drawing illustrating results of observation of bent heads when 180°-close-contact bending deformation is performed on the nickel layers of (A) and (B) in the drawing with the scanning electron microscope. In the "Ni plating-SUS," countless cracks are observed on the plated surface. In contrast to this, in the "clad Ni-SUS" in which the diffusion bonding was performed on the nickel layer, the crack is not observed at all and the nickel layer deforms following the deformation of the metal base material layer. It has been confirmed from an EDS analysis result of a nickel element that the nickel layer is not torn and covers the base material surface and this ensures guaranteeing the excellent conductive property and corrosion resistance even at the bending portion and the like.

Figure 5:
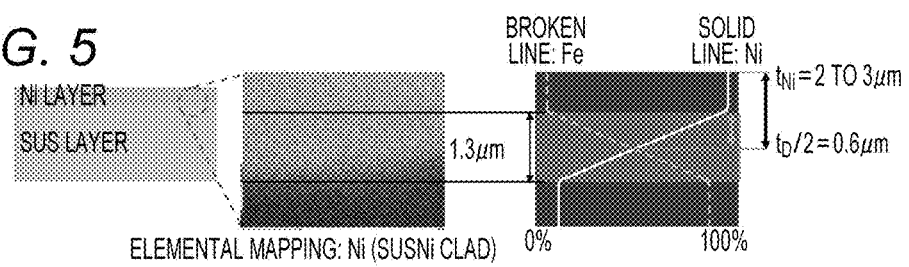
FIG. 5 is an explanatory drawing of a diffusion layer between a metal base material layer and the nickel layer.
Figure 6:
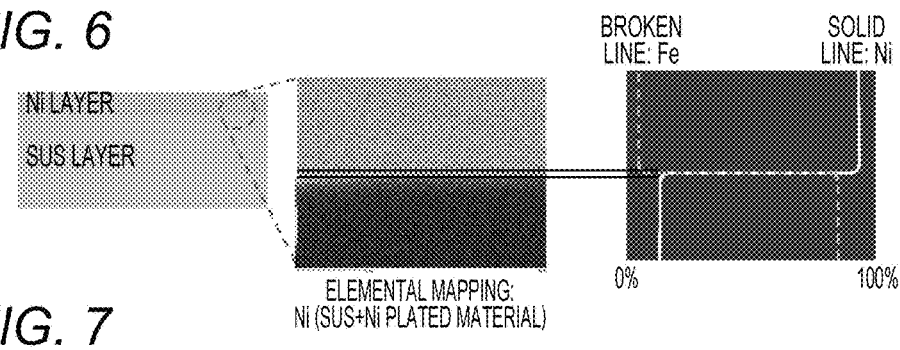
FIG. 6 is an explanatory drawing of an interface between the metal base material layer and the nickel layer.

FIGS. 5 and 6 are drawings of results of elemental mappings of the metal base material layers and the nickel layers on the cross-sectional surfaces of (A) and (B) in FIG. 4B. In the "Ni plating-SUS," although an interference of signals from both layers is recognized at an interface between the nickel layer and a stainless steel layer, a region where atoms are mutually diffused is not observed. In contrast to this, in the "clad Ni-SUS" where the diffusion bonding was performed on the nickel layer, an apparent diffusion layer is formed. The presence of this layer enhances the adhesiveness of the metal base material layer to the nickel layer.

The method for manufacturing the reinforcing member 135 is not specifically limited. For example, with the use of the stainless steel as the metal base material, the reinforcing member 135 can be manufactured by the following rolling method. For manufacture by the rolling method, Ni plates with a predetermined thickness are preliminarily attached to both surfaces of a slab of the stainless steel as the metal base material, and the peripheral area of the assembled slab is welded. After heating the assembled slab, on which vacuum drawing was performed such that the interface became the vacuum state, at 1100° C. or more, the assembled slab was designed to be 2.0 mm or less by hot rolling to obtain a hot-rolled steel strip. This hot-rolled steel strip is used. After this hot-rolled steel strip is annealed and pickled, the hot-rolled steel strip is formed into a predetermined intermediate thickness by cold rolling. Afterwards, bright annealing is performed again at 900° C. or more and further the cold rolling is performed to finish the hot-rolled steel strip into a predetermined thickness. The method for manufacturing the hot-rolled steel strip having the three-layer structure of Ni/SUS/Ni is not especially limited. A method that performs pack rolling on coils of Ni, SUS, and Ni and then performs diffusion annealing may be applicable.

(Printed Wiring Board Reinforcing Member 135: Conductive Adhesive Layer 130)

The reinforcing member 135 configured as described above may include the conductive adhesive layer 130. The conductive adhesive layer 130 is disposed on the lower surface side of the metal base material 135a. Specifically, the conductive adhesive layer 130 is laminated on the lower surface of the metal base material 135a. Since the reinforcing member 135 includes the conductive adhesive layer 130, a process of installing the conductive adhesive layer 130 to the reinforcing member 135 can be omitted when the reinforcing member 135 is installed to the flexible printed wiring board main body 110. This makes it possible to easily bond the reinforcing member 135 to the ground wiring pattern 115 of the flexible printed wiring board 1 in the conductive state.

The conductive adhesive layer 130 is formed of an adhesive that exhibits either isotropic conductivity or anisotropic conductivity. The isotropic conductive adhesive has identical electric characteristics to those of conventional solders. For this reason, when the conductive adhesive layer 130 is formed of the isotropic conductive adhesive, an electrical conductive state can be secured in all three-dimensional directions constituted of a thickness direction, a width direction, and a longitudinal direction. On the other hand, when the conductive adhesive layer 130 is formed of the anisotropic conductive adhesive, an electrical conductive state can be secured in only two-dimensional directions constituted of the thickness direction. The conductive adhesive layer 130 may be formed of a conductive adhesive formed by mixing conductive particles containing a soft magnetic material as the main component and the adhesive.

As the adhesive contained in the conductive adhesive layer 130, acrylic-based resin, epoxy-based resin, silicon-based resin, thermoplastic elastomer-based resin, rubber-based resin, polyester-based resin, urethane-based resin, and the like are listed. The adhesive may be the above-described single resin or a mixture of the resins. The adhesive may further contain a tackifier. As the tackifier, fatty acid hydrocarbon resin, C5/C9 mixed resin, rosin, rosin derivative, terpene resin, aromatic hydrocarbon resin, thermally reactive resin, and the like are listed.

In this embodiment, the conductive adhesive layer 130 is laminated on the metal base material layer 135a, but this should not be construed in a limiting sense. That is, the conductive adhesive layer 130 may be laminated via the nickel layer 135c. Also, the reinforcing member 135 may include the conductive adhesive layer 130 when necessary. That is, the reinforcing member 135 may be configured to include the metal base material 135a and the nickel layer 135b or may be configured to include the metal base material 135a, the nickel layer 135b, and the conductive adhesive layer 130.

(Method for Manufacturing Printed Circuit Board 10: Manufacture of Reinforcing Member 135)

First, a metal thin plate with a predetermined thickness and a predetermined width made of a stainless steel and the like that will be the metal base material layer 135a is prepared. A nickel thin plate with a predetermined thickness and a predetermined width made of nickel that will be the nickel layer 135b is prepared. Then, the metal thin plate and the nickel thin plate are in close contact and heated and pressurized in the atmosphere such as vacuum or inert gas.

The heating temperature is a temperature meeting a condition of equal to or less than melting points of the stainless steel and the nickel. The applied pressure is set to the extent at which plastic deformation does not occur. This forms an combination of the reinforcing member 135 formed by performing the diffusion bonding on the nickel layer 135b to the metal base material layer 135a. Then, the unhardened conductive adhesive layer 130 is adhered or coated to the lower surface of the combination of the reinforcing member 135. This forms the combination of the reinforcing member 135 including the conductive adhesive layer 130.

Next, the cutting or the punching process is performed on a single plate formed of the combination of the reinforcing member 135 by a predetermined dimension in the respective vertical direction and lateral direction. This fabricates a plurality of the reinforcing members 135. In this respect, since the metal base material layer 135a and the nickel layer 135b are bonded by the diffusion layer formed by diffusion bonding, a failure such as peeling of the nickel layer 135b from the metal base material layer 135a is less likely to occur. This ensures maintaining the high yield even with the short cycle time of the cutting or the punching process.

As illustrated in FIG. 3, when the nickel layers 135b and 135c diffuse bond at both surfaces of the metal base material layer 135a and the surface state of the nickel layer 135c is configured to have a shape to enhance the adhesiveness of the conductive adhesive layer 130, a failure such as peeling of the conductive adhesive layer 130 from the nickel layer 135c and the like can also be less likely to occur.

(Method for Manufacturing Printed Circuit Board 10: Installing of Reinforcing Member 135)

Next, as illustrated in FIG. 1, the reinforcing member 135 is disposed on the printed wiring board main body 110 such that the conductive adhesive layer 130 is opposed to the hole 160. Using two heated plates at first temperature (for example, 120° C.), to sandwich the reinforcing member 135 and the printed wiring board main body 11 in the up-down direction for pressing at a first pressure (0.5 MPa) and for a first period (for example, 5 seconds). Accordingly, the reinforcing member 135 is temporarily fixed to the printed wiring board main body 110.

Next, the two heated plates are heated to second temperature (170° C.), which is higher than the temperature during the temporal fixing. Using the heated plates at the second temperature to sandwich the reinforcing member 135 and the printed wiring board main body 110 in the up-down direction for pressurization at second pressure (3 MPa) and for second period (for example, 30 minutes). This ensures securely installing the reinforcing member 135 to the printed wiring board main body 110 while the inside of the hole 160 is filled with the conductive adhesive layer 130.

A heat treatment is performed when the reinforcing member 135 is installed to the printed wiring board main body 110. In view of this, when the reinforcing member 135 is stainless steel, a strong oxide film is formed on the surface of the reinforcing member 135 so that the electric resistance may increase. However, in this embodiment, since the nickel layer 135b is formed on the surface of the metal base material layer 135a in the reinforcing member 135, the oxide film caused by the heat treatment in the manufacturing process of the printed wiring board 1 may be prevented.

The detailed description provided hereinabove mainly describes the characteristic parts for the purpose of ensuring easier understanding of the present invention; however, the present invention shall not be limited to the above-described embodiments in DESCRIPTION OF EMBODIMENTS and is also applicable to other embodiments. Further, the terms and the phraseology used in the present specification are employed to provide specific explanation of the present invention, and are not used to limit the interpretation of the present invention. Further, it is obvious that those skilled in the art easily infers other structures, systems, methods, and the like included in the concept of the present invention from the concept of the present invention described in the present specification. The description of claims therefore shall encompass structures equivalent to the present invention, unless otherwise such structures depart from the technical idea of the present invention. To fully understand the object and effects of the present invention, it is desirable to sufficiently consider the literature and the like that have been already disclosed.

For example, the printed wiring board 1 according to the embodiment may include a film on the insulating film 111. The film includes a conductive material provided on the insulating film 111, a conductive layer adhered to the conductive material in a contact state, and an insulating layer provided on the conductive layer. The film includes the conductive layer and therefore has a function of shielding electromagnetic waves.

WORKING EXAMPLES

Specimens were fabricated by the following method for comparisons of bending workability, interface adhesiveness, and a contact resistance value of a reinforcing member (a printed wiring board reinforcing member) on which the nickel layer was formed by the diffusion bonding with a reinforcing member (a printed wiring board reinforcing member) on which a nickel layer was formed by plating.

(Fabrication of Reinforcing Member by Diffusion Bonding)

The reinforcing member including the diffusion layer was fabricated by performing a clad rolling on a nickel plate with the thickness of 1 mm to a stainless steel plate (SUS304)

with the thickness of 150 mm such that a pure Ni layer thickness tNi and a diffusion layer thickness TD became the values shown in Table 2.

Specifically, a reinforcing member having the pure Ni layer thickness tNi of 1.6 μm and the diffusion layer thickness TD of 1.6 μm was created as Working Example 1. A reinforcing member having the pure Ni layer thickness tNi of 1.1 μm and the diffusion layer thickness TD of 1.8 μm was created as Working Example 2. A reinforcing member having the pure Ni layer thickness tNi of 2.2 μm and the diffusion layer thickness TD of 2.2 μm was created as Working Example 3. A reinforcing member having the pure Ni layer thickness tNi of 1.2 μm and the diffusion layer thickness TD of 1.1 μm was created as Working Example 4. A reinforcing member having the pure Ni layer thickness tNi of 1.7 μm and the diffusion layer thickness TD of 3.2 μm was created as Working Example 5. A reinforcing member having the pure Ni layer thickness tNi of 0.9 μm and the diffusion layer thickness TD of 3.0 μm was created as Working Example 6. A reinforcing member having the pure Ni layer thickness tNi of 0.7 μm and the diffusion layer thickness TD of 4.2 μm was created as Working Example 7. A reinforcing member having the pure Ni layer thickness tNi of 0.4 μm and the diffusion layer thickness TD of 5.0 μm was created as Working Example 8.

(Fabrication of Reinforcing Member by Plating)

A reinforcing member with a nickel plated layer was fabricated by performing a plating treatment using a sulfamic acid nickel bath on a stainless steel plate (SUS304) such that a thickness of a nickel plated layer had the value shown in Table 2. Specifically, a reinforcing member having the pure Ni layer thickness tNi of 2.1 μm was created as Comparative Example 1. A reinforcing member having the pure Ni layer thickness tNi of 3.5 μm was created as Comparative Example 2. A reinforcing member having the pure Ni layer thickness tNi of 1.9 μm was created as Comparative Example 3. A reinforcing member with the pure Ni layer thickness tNi of 2.4 μm was created as Comparative Example 4.

(Bending Workability)

The comparisons of the bending workability between the reinforcing members in which the nickel layer was formed by the diffusion bonding and the reinforcing members in which the nickel layer was formed by plating were treated as comparison results of the bonding strength. The reason is that, as illustrated in FIG. 5, in the case where the diffusion bonding is performed on the nickel layer to the metal base material, both layers are firmly joined together via the diffusion layer and the interface is not present; therefore, the peeling does not occur between the metal base material and the nickel layer. As a result, the metal base material layer and the nickel layer were simultaneously plastically deformed and the deformation states of both layers were observed to determine whether the bonding strength was good or bad. Specifically, the evaluation was conducted by the following testing method.

(Bending Workability: Testing Method)

Samples of the reinforcing members of Working Examples 1 to 8 and Comparative Examples 1 to 4 with the length of 50 mm and the width of 20 mm were collected. After these samples were compressed in the longitudinal direction and bent into a U shape, the samples were bent 180° until the inner surface sides were in close contact. Working Examples 1 to 8 had the rolling direction of the metal base material as the length direction of the samples. Afterwards, the states of the nickel layers were measured through observation of a broken state at the heads of the bent portions and the presence/absence of the peeling at the interfaces of the nickel layers with the scanning electron microscope. The measurement result was determined as "Poor" when the interface peeling was present like (A) in FIG. 4B. The absence of the interface peeling like (B) in FIG. 4B was determined as "Good."

(Interface Adhesiveness)

Figure 11A:
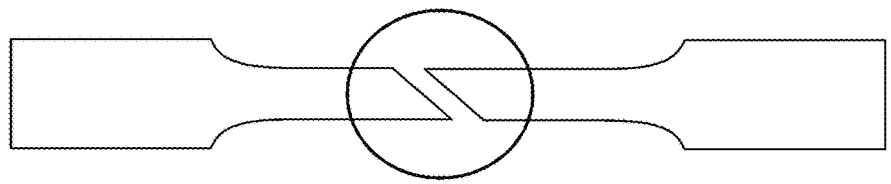
FIG. 11A is an explanatory drawing illustrating a tensile test.
Figure 11B:
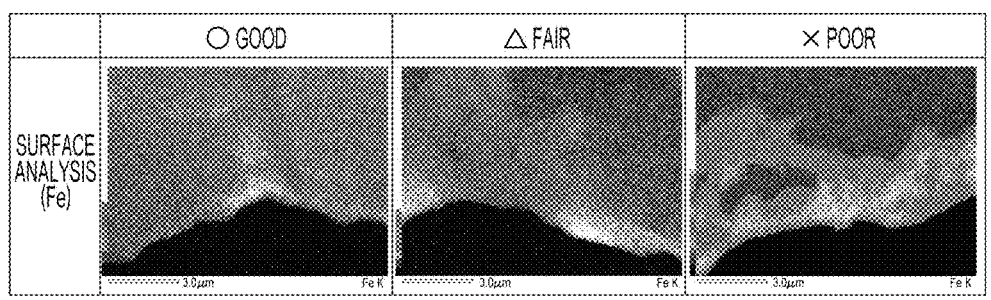
FIG. 11B is an explanatory drawing illustrating states of ruptured end portions in the tensile test.

Next, the interface adhesiveness was evaluated on the respective reinforcing members of Working Examples 1 to 8 and Comparative Examples 1 to 4. Specifically, as illustrated in FIG. 11A, the respective reinforcing members were processed into JIS 13-B specimens. A tensile test that pulled the specimens until the specimens ruptured was conducted under a condition of a tension speed of 10 mm/min using a tensile tester (5569A, manufactured by INSTRON). A surface near the ruptured portion of the ruptured specimen was observed with an energy dispersive X-ray spectrometer (EDS) for evaluation on the interface adhesiveness. As illustrated in FIG. 11B, the evaluation results were determined as "Good" when Fe, the base material, was not detected, determined as "Fair" when the Fe was slightly detected, and determined as "Poor" when the Fe was apparently detected.

(Contact Resistance Value)

Figure 12:
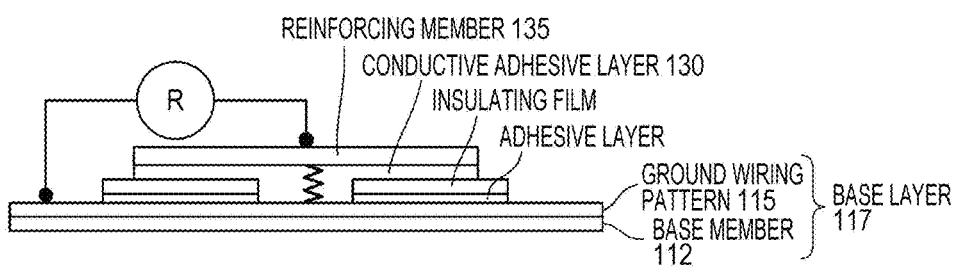
FIG. 12 is an explanatory drawing illustrating a measuring method for an electric resistance value between the reinforcing member and a base layer.

Next, the respective contact resistance values (MΩ) of the reinforcing members of Working Examples 1 to 8 and Comparative Examples 1 to 4 were measured. Specifically, using a "variable-load contact resistance measurement device" manufactured by YAMASAKI SEIKI KENKYUSHO Inc., the load was fixed at 0.5 N and as illustrated in FIG. 12, the electric resistance value between the reinforcing member and a base layer was measured.

(Bending Workability, Interface Adhesiveness, Contact Resistance Value: Test Results)

As shown in Table 2, the bending workability was "Good" in Working Examples 1 to 7 and "Poor" in Working Example 8 and Comparative Examples 1 to 4. The interface adhesiveness was "Fair" in Working Examples 1 to 3, "Good" in Working Examples 4 to 8, and "Poor" in Comparative Examples 1 to 4. The contact resistance value was 5.9 mΩ in Working Example 1, 6.1 mΩ in Working Example 2, 5.6 mΩ in Working Example 3, 6 mΩ in Working Example 4, 5.6 mΩ in Working Example 5, 6 mΩ in Working Example 6, 5.8 mΩ in Working Example 7, 6.7 mΩ in Working Example 8, 7.1 mΩ in Comparative Example 1, 7.2 mΩ in Comparative Example 2, 7.2 mΩ in Comparative Example 3, and 6.9 mΩ in Comparative Example 4

TABLE 2

|  | Pure Ni layer thickness (μm) $t_{Ni}$ | Thickness of diffusion layer (μm) $t_D$ | One-half diffusion layer thickness (μm) $t_D/2$ | Pure Ni layer + One-half diffusion layer thickness (μm) $t_{Ni} + (t_D/2)$ | Diffusion layer ratio $(t_D/2)/\{t_{Ni} + (t_D/2)\}$ | Presence/ absence of film crack at 180° bending | Ni/SUS Interface adhesiveness | Contact resistance value (m/Ω) | Remarks Constitution |
|---|---|---|---|---|---|---|---|---|---|
| Working example 1 | 1.6 | 1.6 | 0.8 | 2.40 | 0.33 | Good | Fair | 5.9 | Ni/SUS |
| Working example 2 | 1.1 | 1.8 | 0.9 | 2.00 | 0.45 | Good | Fair | 6.1 | Ni/SUS |

TABLE 2-continued

|  | Pure Ni layer thickness (μm) $t_{Ni}$ | Thickness of diffusion layer (μm) $t_D$ | One-half diffusion layer thickness (μm) $t_D/2$ | Pure Ni layer + One-half diffusion layer thickness (μm) $t_{Ni} + (t_D/2)$ | Diffusion layer ratio $(t_D/2)/\{t_{Ni} + (t_D/2)\}$ | Presence/absence of film crack at 180° bending | Ni/SUS Interface adhesiveness | Contact resistance value (m/Ω) | Remarks Constitution |
|---|---|---|---|---|---|---|---|---|---|
| Working example 3 | 2.2 | 2.2 | 1.1 | 3.30 | 0.33 | Good | Fair | 5.6 | Ni/SUS |
| Working example 4 | 1.2 | 2.2 | 1.1 | 2.30 | 0.48 | Good | Good | 6 | Ni/SUS |
| Working example 5 | 1.7 | 3.2 | 1.6 | 3.30 | 0.48 | Good | Good | 5.6 | Ni/SUS |
| Working example 6 | 0.9 | 3 | 1.5 | 2.40 | 0.63 | Good | Good | 6 | Ni/SUS |
| Working example 7 | 0.7 | 4.2 | 2.1 | 2.80 | 0.75 | Good | Good | 5.8 | Ni/SUS |
| Working example 8 | 0.4 | 5 | 2.5 | 2.90 | 0.86 | Poor | Good | 6.7 | Ni/SUS |
| Comparative Example 1 | 2.1 | — | — | — | — | Poor | Poor | 7.1 | Ni plated material |
| Comparative Example 2 | 3.5 | — | — | — | — | Poor | Poor | 7.2 | Ni plated material |
| Comparative Example 3 | 1.9 | — | — | — | — | Poor | Poor | 7.2 | Ni plated material |
| Comparative Example 4 | 2.4 | — | — | — | — | Poor | Poor | 6.9 | Ni plated material |

Thus, the interface adhesiveness of Working Examples 1 to 3 is "Fair," and the interface adhesiveness of Working Examples 4 to 8 is "Good." In contrast to this, the interface adhesiveness of Comparative Examples 1 to 4 was "Poor." Accordingly, it has become apparent that the reinforcing members on which the diffusion bonding was performed (Working Examples 1 to 7) has the excellent interface adhesiveness compared with the reinforcing members on which plating bonding was performed (Comparative Examples 1 to 4). Since the creation of the specimens was technically, timewise, and economically difficult, reinforcing members with thicknesses of diffusion layers outside the range of 1.6 μm to 5 μm (the diffusion layer ratios were 0.33 to 0.86) were not able to be created. However, it can be easily estimated that the identical test results are obtained from these reinforcing members outside the range based on the test results.

Furthermore, while the interface adhesiveness of Working Examples 1 to 3 is "Fair," the interface adhesiveness of Working Examples 4 to 8 is "Good." From this, it has become apparent that the interface adhesiveness of Working Examples 4 to 8 is excellent among the reinforcing members (Working Examples 1 to 7) on which the diffusion bonding was performed. Accordingly, it has become apparent that the reinforcing members with the thicknesses of the diffusion layers of 2.2 μm to 5 μm (the diffusion layer ratios are 0.48 to 0.86) are more preferable because good interface adhesiveness is obtained.

The contact resistance values of Working Examples 1 to 8 are in a range of 5.6 Ωm to 6.7 Ωm, and the contact resistance values of Comparative Examples 1 to 4 are in a range of 6.9 Ωm to 7.2 Ωm. From this, it has become apparent that the reinforcing members on which the diffusion bonding was performed (Working Examples 1 to 7) had the contact resistance values smaller than the reinforcing members on which the plating bonding was performed (Comparative Examples 1 to 4). Since the creation of the specimens was technically, timewise, and economically difficult, reinforcing members with thicknesses of diffusion layers outside the range of 1.6 μm to 5 μm (the diffusion layer ratios were 0.33 to 0.86) were not able to be created. However, it can be easily estimated that the identical test results are obtained from these reinforcing members outside the range based on the test results.

The bending workability of Working Examples 1 to 7 is "Good," and the bending workability of Working Example 8 and Comparative Examples 1 to 4 is "Poor." It has become apparent from this that, in terms of the bending workability and the interface adhesiveness, the reinforcing members with the thicknesses of the diffusion layers of 1.6 μm to 4.2 μm (the diffusion layer ratios are 0.33 to 0.75) are preferable because the satisfactory interface adhesiveness is obtained. Since the creation of the specimens was technically, timewise, and economically difficult, reinforcing members with thicknesses of diffusion layers less than 1.6 μm (the diffusion layer ratios less than 0.33) were not able to be created. However, it can be easily estimated that the identical test results are obtained from these reinforcing members with values less than the values based on the test results.

As shown by the above-described three kinds of test results, the reinforcing members on which the diffusion bonding was performed have excellent surface crack resistance during close-contact bending, interface adhesiveness, and contact resistance value compared with the reinforcing members on which the nickel plating was performed. Therefore, the reinforcing member on which the diffusion bonding has been performed can maintain the high-reliable ground effect and reinforcement function over a long period.

Figure 10:
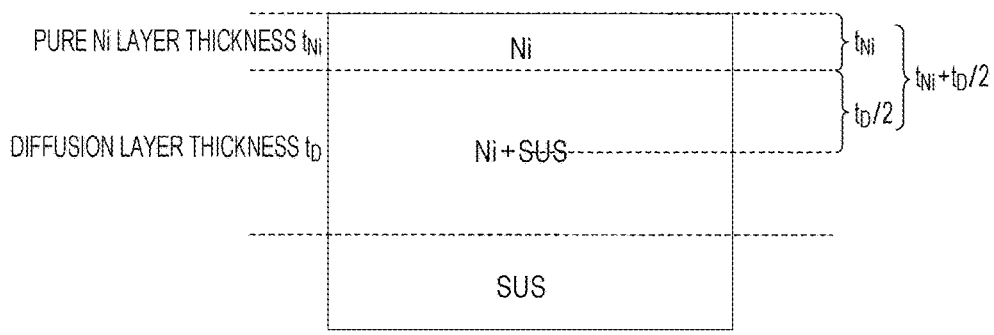
FIG. 10 is an explanatory drawing of the diffusion layer between the metal base material layer and the nickel layer.

Specifically, based on the layer constitution illustrated in FIG. 10, the thickness tD of the diffusion layer in the reinforcing member on which the diffusion bonding was performed is preferably 4.5 μm or less (the diffusion layer ratio: $(tD/2)/\{tNi+(tD/2)\} \leq 0.86$). Expressing by the diffusion layer ratio $(tD/2)/\{tNi+(tD/2)\}$, the relationship between the thickness tD of the diffusion layer in the reinforcing member on which the diffusion bonding was performed and the distance tNi from the center position of the diffusion layer to the superficial layer surface of the nickel layer (the diffusion layer ratio) is preferably $(tD/2)/\{tNi+(tD/2)\} \leq 0.86$.

Furthermore, the reinforcing member with the thickness tD of the diffusion layer is 2.2 μm to 4.2 μm (the diffusion layer ratio is 0.48 to 0.75) is more preferable because better interface adhesiveness is obtained. Expressing by the diffusion layer ratio (tD/2)/tNi, the reinforcing member with $0.48 \leq (tD/2)/\{tNi+(tD/2)\} \leq 0.86$ is more preferable because better interface adhesiveness is obtained.

Furthermore, the reinforcing member with the thickness tD of the diffusion layer of 4.2 μm or less is further preferable because the good bending workability is obtained, in addition to the interface adhesiveness and contact resistance value. That is, the reinforcing member with the thickness tD of the diffusion layer of 2.2 μm to 4.2 μm is further preferable because the good interface adhesiveness, contact resistance value, and interface adhesiveness are obtained. Expressing by the diffusion layer ratio (tD/2)/{tNi+(tD/2)}, the reinforcing member with $(tD/2)/\{tNi+(tD/2)\} \leq 0.75$ is further preferable because the good bending workability is obtained in addition to the interface adhesiveness and contact resistance value. That is, the reinforcing member with $0.48 \leq (tD/2)/\{tNi+(tD/2)\} \leq 0.75$ is further preferable because the good interface adhesiveness, contact resistance value, and interface adhesiveness are obtained.

(Bonding Force of Conductive Adhesive Layer 130)

Figure 7:
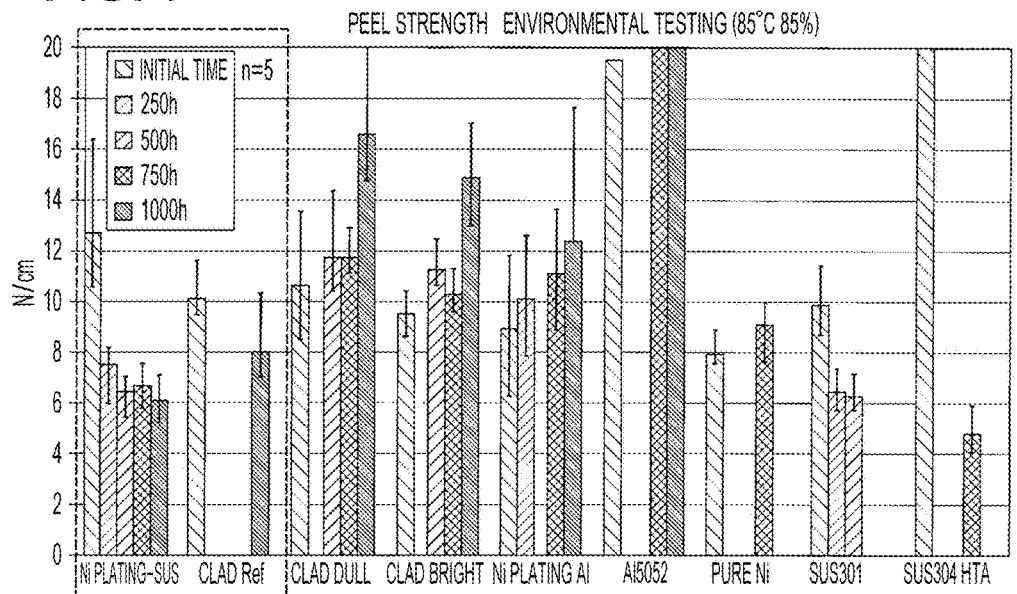
FIG. 7 is a graph illustrating a peel strength of a conductive adhesive layer.

Various samples formed by bonding the conductive adhesive layers 130 to the various metal base material layers and nickel layers were fabricated. A peel strength in an environmental testing (temperature: 85 degrees, humidity: 85%) was measured at the initial time, elapse of 250 hours, elapse of 500 hours, elapse of 750 hours, and elapse of 1050 hours. The bonding force was measured in accordance with the mechanical performance test, peel strength of copper foil, method A (90°-direction peel) in JIS C 6471 (1995). FIG. 7 illustrates the measurement results. It has been proved from the measurement results that the bonding forces to the conductive adhesive layers 130 differ depending on the surface states (the standard roughness type, the dull type, and the bright type) of the nickel layers 135c.

(Connection Resistance of Reinforcing Member 135 Including Conductive Adhesive Layer 130)

Figure 8:
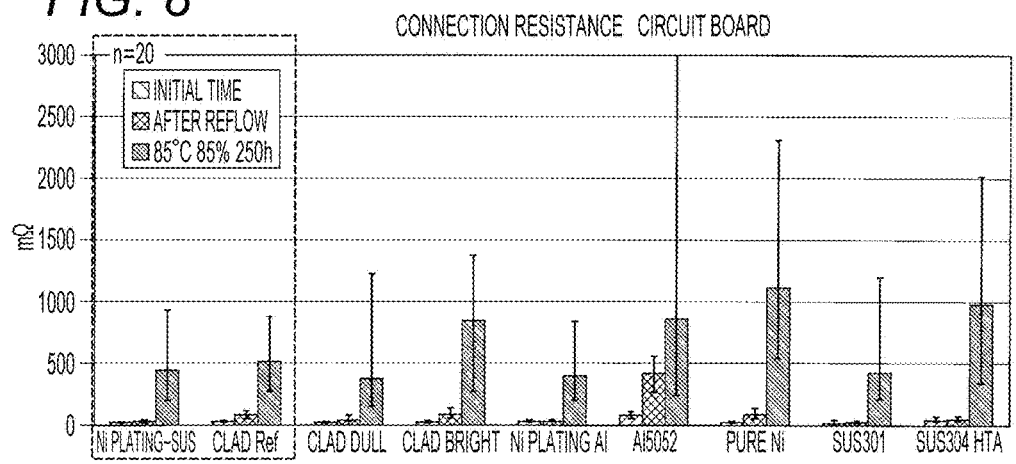
FIG. 8 is a graph illustrating a connection resistance of a printed wiring board reinforcing member.

Various samples formed by bonding the conductive adhesive layers 130 to the various metal base material layers and nickel layers were fabricated. The connection resistance of the reinforcing member 135 with the ground wiring pattern 115 was measured at the initial time, after the reflow, and at elapse of 250 hours of the environmental testing (temperature: 85 degrees, humidity: 85%). Specifically, using the "variable-load contact resistance measurement device" manufactured by YAMASAKI SEIKI KENKYUSHO Inc., the load was fixed at 0.5 N and as illustrated in FIG. 12, the electric resistance value between the reinforcing member 135 and a base layer 117 was measured. FIG. 8 illustrates the measurement results.

(Contact Resistance of Reinforcing Member 135 Including Conductive Adhesive Layer 130)

Figure 9:
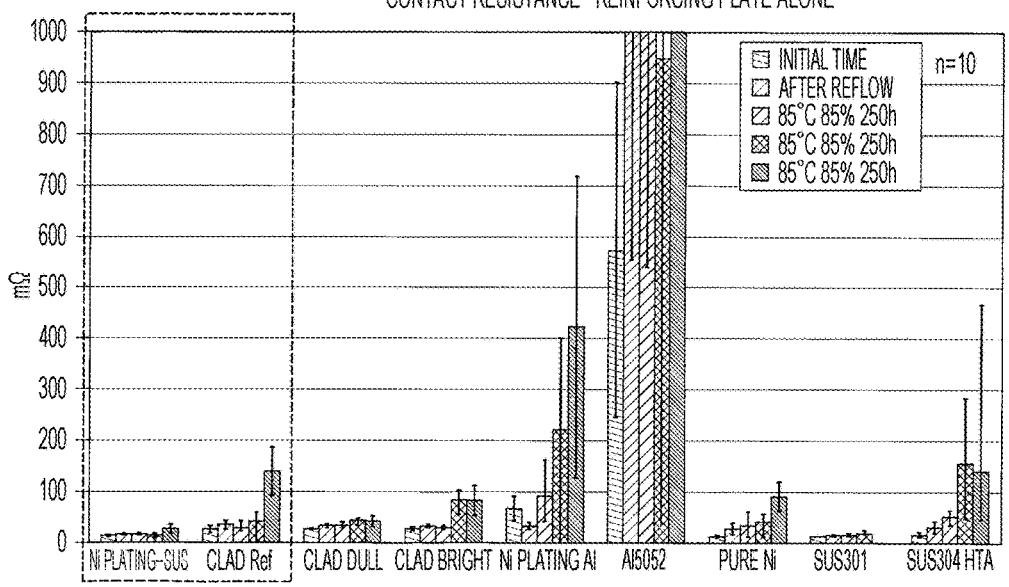
FIG. 9 is a graph illustrating a contact resistance of the printed wiring board reinforcing member.

Various samples formed by bonding the conductive adhesive layers 130 to the various metal base material layers and nickel layers were fabricated. The contact resistance of the nickel layer 135b in the reinforcing member 135 was measured at the initial time, after the reflow, at elapse of 250 hours of the environmental testing (temperature: 85 degrees, humidity: 85%), at elapse of 500 hours, and at elapse of 750 hours. For the measurement of the contact resistance, using the "variable-load contact resistance measurement device" manufactured by YAMASAKI SEIKI KENKYUSHO Inc., the load was fixed at 0.5 N, and the surface electric resistance values on both surfaces of the reinforcing member were measured. FIG. 9 illustrates the measurement results.

This application claims priority from Japanese Patent Application No. 2015-112296 filed with the Japan Patent Office on Jun. 2, 2015, the entire content of which is hereby incorporated by reference.

The above description of specific embodiments of the present invention is disclosed as illustrative. This does not intend to be exhaustive or limit the present invention to the described embodiments as they are. Many modifications and variations will be apparent to those skilled in the art in light of the above description.

DESCRIPTION OF REFERENCE SIGNS

1: Printed wiring board
10: Printed circuit board
110: Printed wiring board main body
111: Insulating film
112: Base member
113: Adhesive layer
115: Ground wiring pattern
130: Conductive adhesive layer
135: Printed wiring board reinforcing member
135a: Metal base material layer
135b, 135c: Nickel layer
160: Hole

The invention claimed is:

1. A printed wiring board comprising:
a base member that includes a ground wiring pattern; and
a printed wiring board reinforcing member bonded to the ground wiring pattern in a conductive state, wherein
the printed wiring board reinforcing member includes:
a metal base material layer; and
a nickel layer bonded, with a diffusion layer, to at least a surface, on a side opposite to a side bonded to the ground wiring pattern, of the metal base material layer, wherein
when a thickness of the nickel layer is tNi, a relationship between a thickness tD of the diffusion layer and a distance {tNi+(tD/2)} from a center position of the diffusion layer to a superficial layer surface of the nickel layer is $(tD/2)/\{tNi+(tD/2)\} \leq 0.80$.

2. The printed wiring board according to claim 1, wherein the diffusion layer has a thickness of 5 μm or less.

3. The printed wiring board according to claim 1, wherein the metal base material layer is made of any of a stainless steel, an aluminum, and an aluminum alloy.

4. A printed wiring board reinforcing member disposed opposed to a ground wiring pattern in a printed wiring board, the printed wiring board reinforcing member having an opposed one surface bonded to the ground wiring pattern in a conductive state, the printed wiring board reinforcing member having another surface electrically conducted with an external ground member at a ground potential, the printed wiring board reinforcing member comprising:
a metal base material layer; and
a nickel layer bonded, with a diffusion layer, to at least one surface of the metal base material layer, wherein
when a thickness of the nickel layer is tNi, a relationship between a thickness tD of the diffusion layer and a distance {tNi+(tD/2)} from a center position of the diffusion layer to a superficial layer surface of the nickel layer is $(tD/2)/\{tNi+(tD/2)\} \leq 0.80$.

5. The printed wiring board reinforcing member according to claim 4, wherein the diffusion layer has a thickness of 5 μm or less.

6. The printed wiring board reinforcing member according to claim 4, wherein the metal base material layer is made of any of a stainless steel, an aluminum, and an aluminum alloy.

7. The printed wiring board reinforcing member according to claim 4, comprising a conductive adhesive layer disposed at one surface side of the metal base material layer.

8. A printed circuit board comprising:
a base member that includes a ground wiring pattern on at least one surface;
a printed wiring board reinforcing member disposed opposed to the ground wiring pattern, the printed wiring board reinforcing member including a nickel layer formed on at least a surface on a side opposite to a side of the ground wiring pattern of the metal base material layer and bonded with a diffusion layer;
a conductive adhesive layer that bonds the ground wiring pattern of the base member and the printed wiring board reinforcing member together in a conductive state; and
an electronic component disposed at a position corresponding to the printed wiring board reinforcing member on another surface of the base member, wherein
when a thickness of the nickel layer is tNi, a relationship between a thickness tD of the diffusion layer and a distance $\{tNi+(tD/2)\}$ from a center position of the diffusion layer to a superficial layer surface of the nickel layer is $(tD/2)/\{tNi+(tD/2)\} \leq 0.80$.

* * * * *

UNITED STATES PATENT AND TRADEMARK OFFICE
CERTIFICATE OF CORRECTION

PATENT NO. : 10,159,142 B2
APPLICATION NO. : 15/578701
DATED : December 18, 2018
INVENTOR(S) : Yuusuke Haruna et al.

It is certified that error appears in the above-identified patent and that said Letters Patent is hereby corrected as shown below:

On the Title Page

Assignee:
Delete "TATSUTA ELECTRIC WIRE & CABLE CO., LTD. (Osaka, JP)"
Insert --TOKUSHU KINZOKU EXCEL CO., LTD. (Tokyo, JP)--

Page 1 of 1

Signed and Sealed this
Seventh Day of April, 2020

Andrei Iancu
*Director of the United States Patent and Trademark Office*